United States Patent [19]

Jones et al.

[11] 3,735,677

[45] May 29, 1973

[54] ANNULAR EXPOSURE SOURCE

[75] Inventors: Michael B. Jones, North Syracuse; Wilfred D. Rublack, Liverpool, both of N.Y.

[73] Assignee: General Electric Company, Syracuse, N.Y.

[22] Filed: Sept. 8, 1972

[21] Appl. No.: 287,439

Related U.S. Application Data

[63] Continuation of Ser. No. 159,591, July 6, 1971, abandoned.

[52] U.S. Cl. ....................................95/1 R, 313/92 B
[51] Int. Cl. ....................................G03, H01j 29/18
[58] Field of Search ..................95/1 R; 313/85, 92 B

[56] References Cited

UNITED STATES PATENTS 3,152,900 10/1964 Kaus et al. ..........................313/92 B
3,601,018 8/1971 Lange ....................................95/1 R

*Primary Examiner*—Samuel S. Matthews
*Assistant Examiner*—Richard M. Sheer
*Attorney*—Marvin Snyder, W. Joseph Shanley, Frank L. Neuhauser et al.

[57] ABSTRACT

Means for exposing selected portions of a photosensitive surface having an apertured mask disposed in spaced relationship thereto. A source of actinic energy having a substantially annular configuration is disposed at a suitable distance from the side of the mask opposite the photosensitive surface. A major portion of the actinic energy falls upon an area of the photosensitive surface which is smaller than the area of the aperture in the mask, facilitating the photochemical processing of well-defined patterns whose dimensions are less than those of the apertures used to form them.

6 Claims, 4 Drawing Figures

ANNULAR EXPOSURE SOURCE

The present invention is a continuation in part of our copending application Ser. No. 159,591, filed July 6, 1971, now abandoned.

BACKGROUND OF THE INVENTION

The invention relates to optical means for exposing photosensitive surfaces, and more particularly to systems wherein preselected portions of photosensitive surfaces to be exposed are defined by apertures in a mask or shield disposed in spaced relationship to the photosensitive surface.

In modern manufacturing processes, the use of radiation-sensitive or photosensitive materials for producing accurate patterns of complex configurations has become quite prevalent. Photoetching and photodeposition processes are now widely used where small size and a high degree of definition are required. For example, such processes are often used in the manufacutre of integrated circuitry, and for producing solid-state electronic devices.

Another area in which photochemical processes are widely used is in the formation of phosphor dots upon the inner surfaces of the faceplates or "screens" of color television cathode ray tubes. As will be recognized by those skilled in the art, most cathode ray tubes for use in color television receivers are provided with a multiplicity of small phosphor dots of circular configuration arranged in a repeating geometric pattern upon the inside of the faceplate of the tube. Ordinarily, three types of phosphors are utilized for the various dots in the pattern, each phosphor producing a different color when impinged upon by electrons emitted by an electron gun located in the neck of the tube. Usually, a three-color system is utilized in which dots producing red, blue and green colors are provided upon the picture tube faceplate. In order to provide the necessary degree of definition, these dots must be kept to a relatively small size. Ordinarily, the diameter of such dots is in the neighborhood of 10 to 20 mils.

In carrying out the process whereby the dots are deposited, a shadow mask is mounted within the picture tube faceplate. Such a mask has formed therein a plurality of circular apertures, each having a diameter of approximately 10 to 20 mils. During operation of the receiver, each aperture serves as a "window" to allow electron beams from the electron guns of the tube to impinge upon a predetermined set of three of the phosphor dots. The mask, however, is also utilized in the manufacture of the dots.

The inside of the tube faceplate is first coated with a photosensitive material which polymerizes upon the incidence of electromagnetic energy in the ultraviolet spectrum. A source of such energy, hereinafter denominated actinic energy, is disposed at a location relative to the faceplate which approximates the location of one of the electron guns. The shadwow mask allows energy from the sources to fall upon defined areas of the faceplate corresponding to the dots to be energized by the electron gun. The mask is then removed and the non-polymerized photosensitive material, along with the phosphor adhering thereto, is washed away, leaving dots of phosphor only where the actinic energy has stuck the photosensitive material. This process is then repeated with the energy source located at the relative position of each of the other electron guns to form others of the set of phosphor dots.

With the advance of picture tube technology, it has been recognized that it may be desirable to create phosphor dots of a somewhat smaller diameter than those heretofore produced. For example, should it be desired to treat the area left between the dots with a black surround matrix, it would be advantageous to form the apertures in the matrix, and/or the phosphor dots, with diameter less than that of the mask aperture. However, with presently-known manufacturing techniques the size of the dot is controlled by the size of the aperture in the shadow mask, and must be at least as large as the aperture. Until recently, in order to manufacture the requisite smaller dots, it has been necessary to utilize a shadow mask having smaller apertures than are needed for the proper operation of the television receiver. The smaller apertures are utilized for forming the smaller matrix apertures and/or dots, then the mask is removed from the faceplate and the apertures are enlarged to the diameter necessary for proper operation of the receiver. The drawbacks of this procedure are apparent, necessitating an additional step in the manufacture of the shadow mask and adding to the cost and complexity of the manufacturing process.

It will therefore be seen that it would be desirable to provide means for irradiating areas upon a photosensitive surface through a shadow mask spaced therefrom, which areas are of a diameter smaller than the corresponding apertures in the shadow mask.

It is therefore an object of the present invention to provide means for irradiating areas of a surface through apertures in a mask spaced therefrom, which areas are smaller than the mask apertures.

It is a further object of the present invention to provide improved means for facilitating the deposition of black matrix material and/or phosphor upon the faceplate of a color television picture tube.

SUMMARY OF THE INVENTION

Briefly stated, in accordance with one aspect of the invention, the foregoing objects are achieved by providing an energy-emitting element which presents to the radiation-sensitive surface an energy source which comprises a substantially closed path surrounding a non-energy emitting central area. Energy emitted from any given point upon the path irradiates, through an aperture, a portion of the radiation-sensitive surface consisting of an inner area which is also irradiated by all other points lying on the path, and a second, peripheral area irradiated by less than all points lying on the path. The inner area thus receives a much greater proportion of emitted energy than does the peripheral irradiated area, so that the area of high energy incidence is substantially smaller than the area of the aperture through which it is irradiated.

In a preferred embodiment of the present invention, a tapered light pipe or "collimator" is utilized to direct actinic energy emitted by an arc lamp toward a photosensitive surface, the end of the collimator presented to the photosensitive surface having a substantially annular configuration.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

DESCRIPTION OF THE PREFERRED EMBODIMENT

Figure 1:
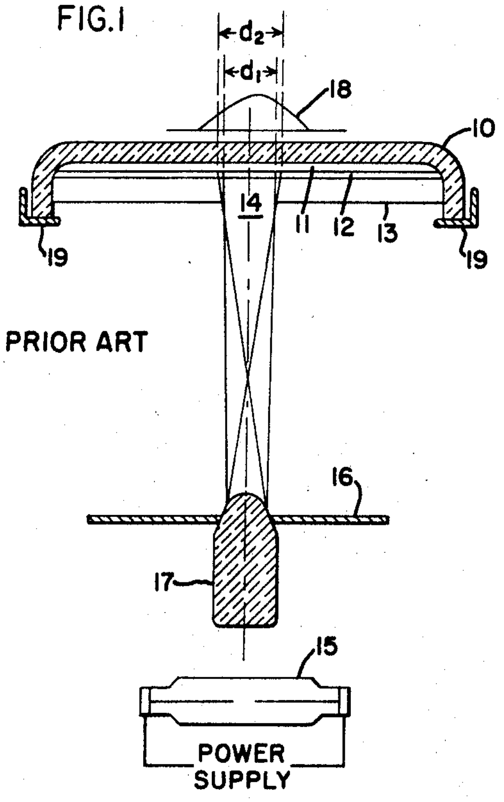
FIG. 1 shows a prior-art system for exposing a photosensitive surface through an aperture, wherein, for simplicity, the components are considered to be coaxial with the tube axis.

Referring now to FIG. 1, there is shown a substrate 10 which may be a glass faceplate panel such as that used to form the viewing screen of a television picture tube, held by supports 19. Deposited upon the substrate or panel is a layer of photosensitive binder 11 which polymerizes after receiving a predetermined quantity of actinic energy. A thin layer of phosphor 12 is deposited upon, and adheres to, the photosensitive binder 11. A mask 13, disposed in spaced relationship to the coated panel 10, has apertures formed therein, such as aperture 14, for allowing actinic energy to impinge upon predetermined areas of the photosensitive surface.

As will be recognized by those skilled in the art, the incidence of sufficient actinic energy through phosphor layer 12 upon photosensitive binder 11 polymerizes the binder. The unpolymerized binder may then be washed away with a suitable solvent, leaving undisturbed the polymerized binder and the phosphor adhering thereto.

Actinic energy is provided by a device such as arc lamp 15, disposed behind an opaque shield 16. A "collimator", such as light pipe 17, is placed in close proximity to lamp 15. As will be recognized by those skilled in the art, light pipe 17 may take the form of a quartz rod having a diffuse surface provided upon the upper or output end thereof, and polished lateral sides so that the light energy is kept from escaping from the sides of the rod through the mechanism of internal reflection. Light entering the lower end of the light pipe is transmitted therethrough and exits at the upper end. The entire upper end of the light pipe thus constitutes a source of actinic energy for exposing the photosensitive surface 11.

A suitable lens (not shown) may be interposed between the light pipe 17 and mask 16 for causing the apparent location of the energy source to vary for different aperture locations. The lens serves to cause actinic energy to traverse each aperture at the same angle as does an electron beam as it is deflected during the operation of a television receiver. It will be appreciated that the figures are intended for illustration only and may not accurately reflect the dimensional relationships of the elements depicted therein.

As shown by the ray tracings generally indicated in FIG. 1, light from the leftward edge of the end of light pipe 17 impinges upon an area of the photosensitive surface extending from the leftward edge of an area having a diameter $d_1$, to the far righward edge of a larger area having a diameter $d_2$. Similarly, light from the rightward edge of the end of light pipe 17 traverses aperture 14 in a manner so as to impinge upon an area extending from the rightward edge of the area having diameter $d_1$ to the leftward edge of the area having diameter $d_2$. Moving inwardly from the edge of the area of diameter $d_2$, progressively more light from the end of light pipe 17 irradiates the photosensitive surface since a progressively larger portion of the light pipe becomes aligned with the aperture edge.

Because a substantially circular aperture 14 is used in conjunction with a substantially circular light pipe 17 the described effect results in formation of an inner area of substantially circular configuration and having a diameter $d_1$, receiving relatively high intensity actinic energy, and an adjacent, concentric area having a substantially circular outer periphery of diameter $d_2$, which receives energy of lesser intensity.

Since, as shown by energy distribution curve 18, the intensity of actinic energy falling upon photosensitive surface 11 varies only gradually as the center of the exposed area is approached, it is quite difficult to accurately predict the amount of exposure necessary to produce a polymerized area which has a predetermined diameter smaller than that of aperture 14.

Figure 2:
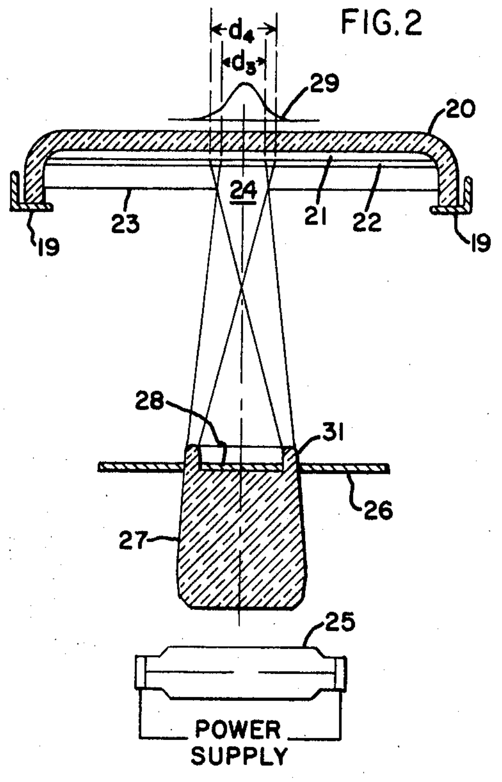
FIG. 2 is an illustration of the improved system comprising one embodiment of the present invention wherein, for simplicity, the components are considered to be coaxial with the tube axis.

In order to produce a highly irradiated area having a diameter smaller than that of the aperture used to define it, the present invention contemplates the use of an optical system such as that shown in FIG. 2. A substrate, shown here as a glass faceplate or panel 20, mounted on supports 19, has disposed thereon a coating of photosensitive binder 21. A thin coating 22 of phosphor is spread upon the photosensitive coating 21 and adheres thereto. An apertured mask 23 is disposed in spaced relationship to the photosensitive surface, and has apertures formed therein, such as aperture 24, for allowing actinic energy to impinge upon a predetermined portion of the photosensitive surface through phosphor layer 22. An arc lamp is disposed beneath an opaque shield 26 and serves to produce actinic energy for irradiating photosensitive surface 11. Protruding through the opaque shield is the output end of the collimator or light pipe 27, herein depicted as having a raised annulus or ring-like ridge 31 at the output end.

The surface of light pipe 27 circumscribed by the inner periphery of annulus 31 has opaque material 28 deposited thereon such that the only actinic energy impinging on mask 23 and photosensitive surface 21 is that which is emitted from the annular end portion 32 of the light pipe. As indicated above, it may be desirable to place a suitable lens between mask 23 and light pipe 27 for providing different apparent source locations for various apertures in mask 23.

For purposes of illustration, the annular light pipe 27 is shown in sectioned form and may be considered as constituting a pair of sources, separated by the inner diameter of the annulus 31. The leftward source, corresponding to the leftward section of the annular light pipe, emits energy in a manner shown by the ray tracings. The energy impinges upon an area of photosensitive surface 21 extending from the leftward edge of a substantially circular area having a diameter $d_3$, to the rightward edge of an outer, substantially circular, concentric area having a diameter $d_4$. In a similar manner the right side of light pipe 27 irradiates an area of the photosensitive surface 21 which extends from the rightward edge of the inner area of diameter $d_3$ to the leftward edge of the outer, concentric area having a diameter $d_4$. It will now be seen from the elements illustrated in FIG. 2 and from the ray tracings therein, that the diameter $d_3$ of the area most heavily impinged upon by actinic energy is substantially smaller than the diameter of aperture 24.

Since actinic energy from the center region of annular light pipe 27 is blocked by opaque material 28, the energy incident upon the area exhibiting diameter $d_4$ increases gradually at locations progressively inward of the periphery, until the inner area exhibiting diameter $d_3$ is encountered. At this point the surface 21 is exposed to energy emitted by the entire annulus 31 and the relative intensity of the energy impinging upon the surface 21 increases rapidly. This characteristic is illustrated by curve 29, which represents the distribution of energy upon the area exposed through aperture 24. The rapid increase in the intensity of impingent energy received which occurs near the periphery of the inner area exhibiting diameter $d_3$ makes it possible to produce a polymerized spot of photosensitive material which is smaller than aperture 24.

Figure 3:
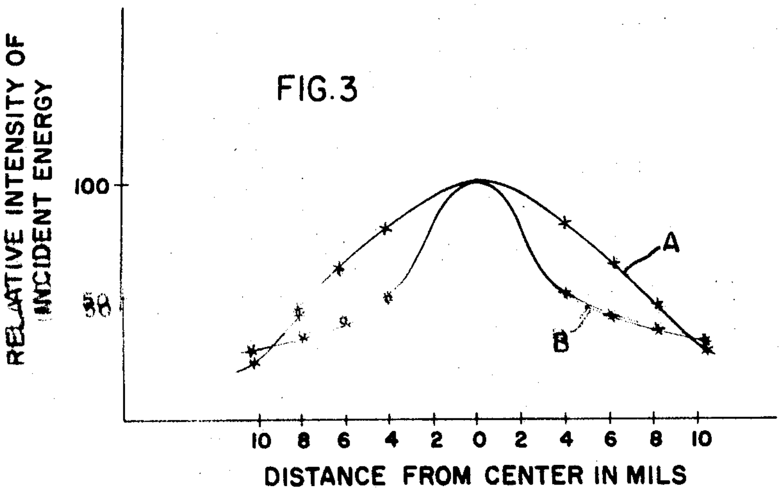
FIG. 3 is a graphical representation of the distribution of actinic energy falling upon a predetermined area of the photosensitive surfaces.

FIG. 3 is a graph showing the calculated distribution of actinic energy falling upon a given area through an aperture, as a function of distance from the center thereof. Curve A reveals that the intensity of incident energy decreases with distance from the center at a relatively constant rate for the case of a single, discrete energy source such as that in the system of FIG. 1. Curve B, on the other hand, shows the calculated energy distribution for the optical system disclosed in FIG. 2. In calculating the curves of FIG. 3, a light pipe-to-photosensitive surface distance of 13.65 inches was postulated, as was a spacing of 0.60 inches between the aperture mask and the photosensitive surface and an aperture diameter of 0.016 inches. Curve A represents the energy distribution which results from using a solid light pipe 17 having a diameter of 0.300 inches, while Curve B represents the energy distribution obtained with light pipe 27 having an annulus at one end exhibiting outside and inside diameters of 0.350 inches and 0.300 inches, respectfully.

It will be noted that for the case of an annular energy source (Curve B), the relative intensity diminishes drastically at relatively small distances from the center of the area, thereby defining a portion of surface 21 which receives actinic energy of relatively high intensity. The portion of surface 21 thus defined is smaller in area than aperture 24.

In theory, it is possible to vary exposure time so as to cause only a predetermined portion of photosensitive surface to receive enough energy to define the desired smaller area, using an actinic energy distribution such as that of Curve A. In practice, however, the control of variables such as radiation intensity, exposure time, and the relative sensitivty of the photosensitive material make it exceedingly difficult to give adequate exposure to an area smaller than that of the aperture, while maintaining sufficiently less exposure in the surrounding areas to avoid producing unduly large exposed area.

Referring again to FIG. 3, if it is assumed that 50 percent of maximum intensity is required to polymerize the photosensitive material, it will be seen that such polymerization will take place over an area approximately 8 mils in diameter for the distribution of Curve B. However, in the case of Curve A, corresponding to the prior art system of FIG. 1, the same level of intensity will produce a polymerized area having a diameter $d_2$ of approximately 15 mils. Moreover, the production of still smaller, well-defined areas is facilitated by the relatively steep slope of Curve B.

Figure 4:
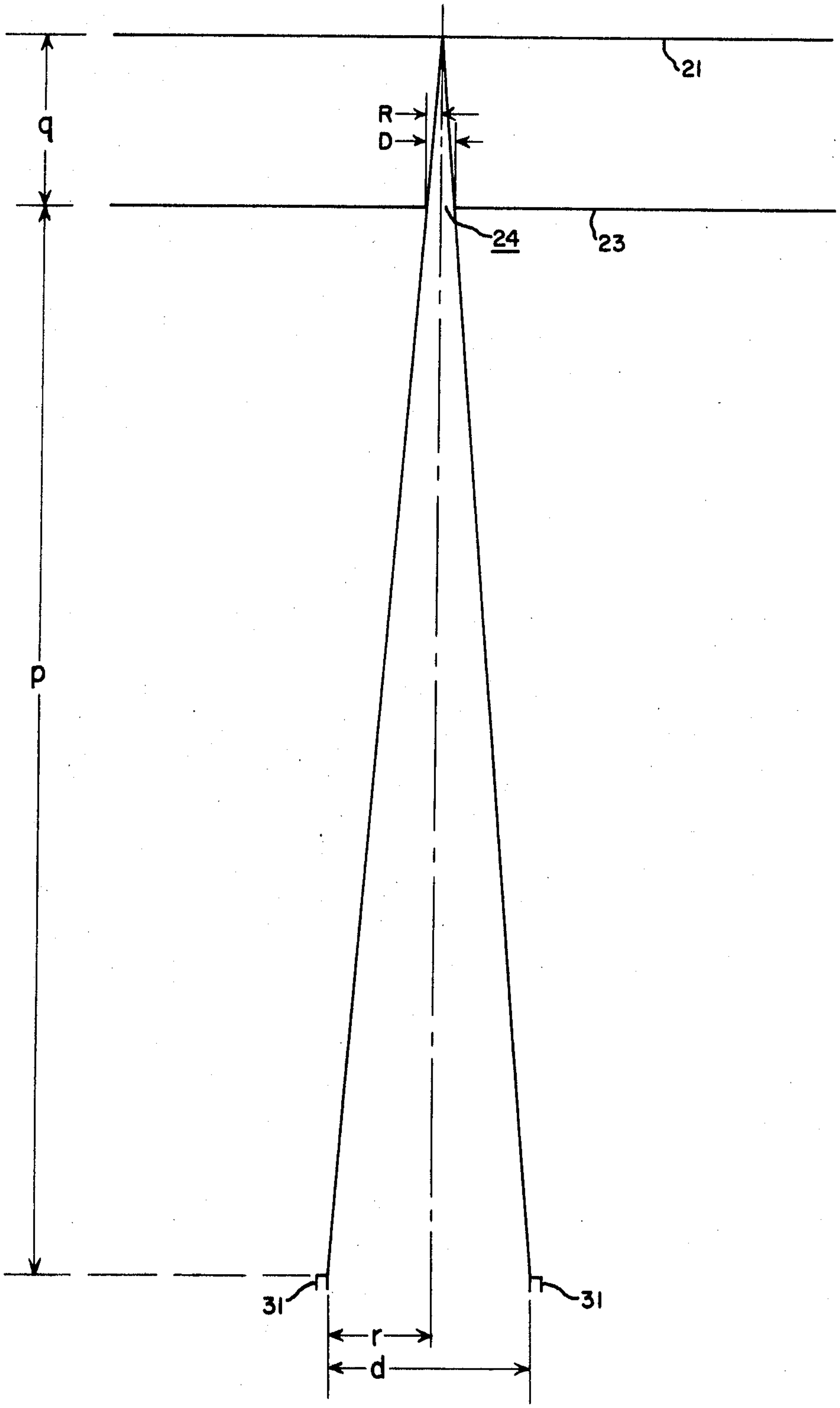
FIG. 4 is an illustration to assist in understanding the geometrical relationships involved in the invention.

By use of FIG. 4, which is a schematic representation of the system shown in FIG. 2, the mathematical constraints on the system illustrated in FIG. 2 can readily be made apparent. The illustration is for the limiting case wherein the rays of energy from the innermost portion of annulus 31 pass through a common aperture 24 and converge at a point on photosensitive surface 21. Let $D$ and $R$ represent the diameter and radius, respectively, of aperture 24 in mask 23, $d$ and $r$ represent the inner diameter and inner radius, respectively, of annulus 31 at the emitting end of light pipe 27, $p$ represent the spacing between annulus 31 and mask 23, and $q$ represent the spacing between photosensitive coating 21 and mask 23. Thus, if the ratio $r/R$ should be decreased from that shown in FIG. 4, either by enlarging aperture 24 or decreasing the inner diameter of annulus 31, then a dark spot will occur at the intersection of the tube axis (represented by the dot-dash line), preventing formation of a phosphor dot at that point. Accordingly, the equation for maintaining the area of a region of high intensity actinic energy on coating 21 smaller than the area of aperture 24 may be expressed as follows:

$$r/R < (p + q/q)$$

or $$d < D\,(p+q)/q$$

Thus it is evident that the ratio of the inner radius of annulus 31 to the radius of aperture 24 must be less than the ratio of the spacing between annulus 31 and photosensitive coating 21 (which is made up of the spacing between annulus 31 and mask 23 plus the spacing between photosensitive coating 21 and mask 23) to the spacing between photosensitive coating 21 and mask 23. This requires that the diameter of annulus 31 be less than the ratio of the product of the diameter of aperture 24 and the spacing between annulus 31 and photosensitive coating 21 to the spacing between photosensitive coating 21 and mask 23.

It will therefore be seen that the annular actinic energy source forming the subject matter of the present invention provides means for exposing an area of a photosensitive surface which is smaller than the aperture used to define the area. Moreover, while the foregoing detailed discussion describes the photodeposition of phosphor dots for purposes of illustration, those skilled in the art will recognize that the same technique can be used for photodeposition of black surround matrix. The annular energy source and system disclosed herein may also be readily adapted for use in other applications wherein a radiation-sensitive surface is to be exposed through apertures provided in a mask to obtain exposed areas which are substantially smaller than the apertures themselves.

While only certain preferred features of the invention have been shown or described, other modifications or applications will occur to those skilled in the art. It is accordingly intended that the appended claims shall encompass all such modifications and applications as do not depart from the true spirit and scope of the invention.

What is claimed as new and desired to be secured by Letters Patent of the United States is:

1. Means for subjecting an energy-sensitive surface to a predetermined configuration of actinic energy, comprising:

mounting means adapted to receive a substrate having a radiation-sensitive coating disposed thereon;

an apertured mask mounted in spaced relationship to said coating; and a source of actinic energy including an annular energy-emitting element disposed about an area from which no energy is emitted, said source being disposed in spaced relationship to said apertured mask and furnishing actinic energy to said coating through an aperture in said mask, the inner diameter of said annular energy-emitting element being less than the ratio of the product of the diameter of said aperture and the separation between said element and said coating to the separation between said mask and said coating so as to irradiate said coating with a spot of high intensity actinic energy surrounded by a region of lesser intensity actinic energy, said spot being of smaller area than said aperture.

2. Apparatus for applying actinic energy to a photosensitive surface comprising:

actinic energy-emitting means disposed about a circular area of first predetermined radius from which no energy is emitted to form an annulus, said actinic energy-emitting means being spaced at a first predetermined distance from said photosensitive surface; and an apertured mask situated between said photosensitive surface and said actinic energy-emitting means and being spaced at a second predetermined distance from said photosensitive surface, said mask containing a circular aperture therein of second predetermined radius for passing actinic energy from said emitting means to said photosensitive surface, the ratio of said first predetermined radius to said second predetermined radius being less than the ratio of said first predetermined distance to said second predetermined distance so as to irradiate said photosensitive surface with a spot of high intensity actinic energy surrounded by a region of lesser intensity actinic energy, said spot being of smaller area than said aperture.

3. A system for irradiating a predetermined area of a photosensitive surface comprising:

means for supporting said photosensitive surface;

a mask containing an aperture therein and spaced at a first predetermined distance from said photosensitive surface;

a source of actinic energy disposed in spaced relationship to said mask; and light pipe means for directing actinic energy from said source toward said photosensitive surface through said aperture in said mask, one end of said light pipe means providing an annular energy-emitting surface disposed about a surface from which no energy is emitted spaced at a second predetermined distance from said photosensitive surface.

the inner diameter of said annular energy-emitting surface being less than the ratio of the product of the diameter of said aperture and said second predetermine distance to said first predetermined distance so as to irradiate said photosensitive surface with a spot of high intensity actinic energy surrounded by a region of lesser intensity actinic energy, said spot being of smaller area than said aperture.

4. The system defined in claim 3, wherein said source of actinic energy comprises an arc lamp.

5. The system defined in claim 4, further including shield means disposed adjacent to said light pipe means about the outer periphery thereof for preventing energy not emitted by said one end of the light pipe means from impinging upon the photosensitive surface.

6. The system defined in claim 5, wherein said end of said light pipe means comprises a raised ring-like ridge, the area circumscribed by the inner periphery of said ring-like ridge having a substantially opaque coating disposed thereon.

* * * * *